United States Patent [19]

Eby

[11] 4,180,770

[45] Dec. 25, 1979

[54] METHOD AND APPARATUS FOR DETERMINING THE CAPACITY OF LEAD ACID STORAGE BATTERIES

[75] Inventor: Richard L. Eby, Marshfield, Mass.

[73] Assignee: Anderson Power Products, Inc., Boston, Mass.

[21] Appl. No.: 882,323

[22] Filed: Mar. 1, 1978

[51] Int. Cl.$^2$ .................... G01N 27/42; G01N 27/46
[52] U.S. Cl. ........................ 324/429; 320/48
[58] Field of Search .............. 320/44, 45, 48; 324/29.5

[56] References Cited

U.S. PATENT DOCUMENTS

| | | | |
|---|---|---|---|
| 3,593,099 | 7/1971 | Scholl | 324/29.5 |
| 3,899,732 | 8/1975 | Staby | 324/29.5 |
| 3,969,667 | 7/1976 | McWilliams | 324/29.5 |
| 3,971,980 | 7/1976 | Jungfer | 324/29.5 |

Primary Examiner—M. Tokar

Attorney, Agent, or Firm—Richard J. Birch

[57] ABSTRACT

A method and apparatus for determining the capacity of lead acid storage batteries are disclosed. The battery's initial open circuit voltage is stored in a settable memory. Thereafter, the open circuit voltage values of the battery throughout the discharge period are determined by measuring loaded voltages with reference to the stored open circuit voltages to detect the discharge rates. The rates of discharge are used to reset the stored value of the initial open circuit voltage measurement thereby producing a moving reference. The memory output value is a function of the capacity of the battery. During the charge period, the charge voltages are measured with reference to the stored open circuit voltages to detect the charge rates. The rates of charge are used to reset the stored value of an initial open circuit voltage measurement. Again, the memory output value is a function of the capacity of the battery.

17 Claims, 1 Drawing Figure

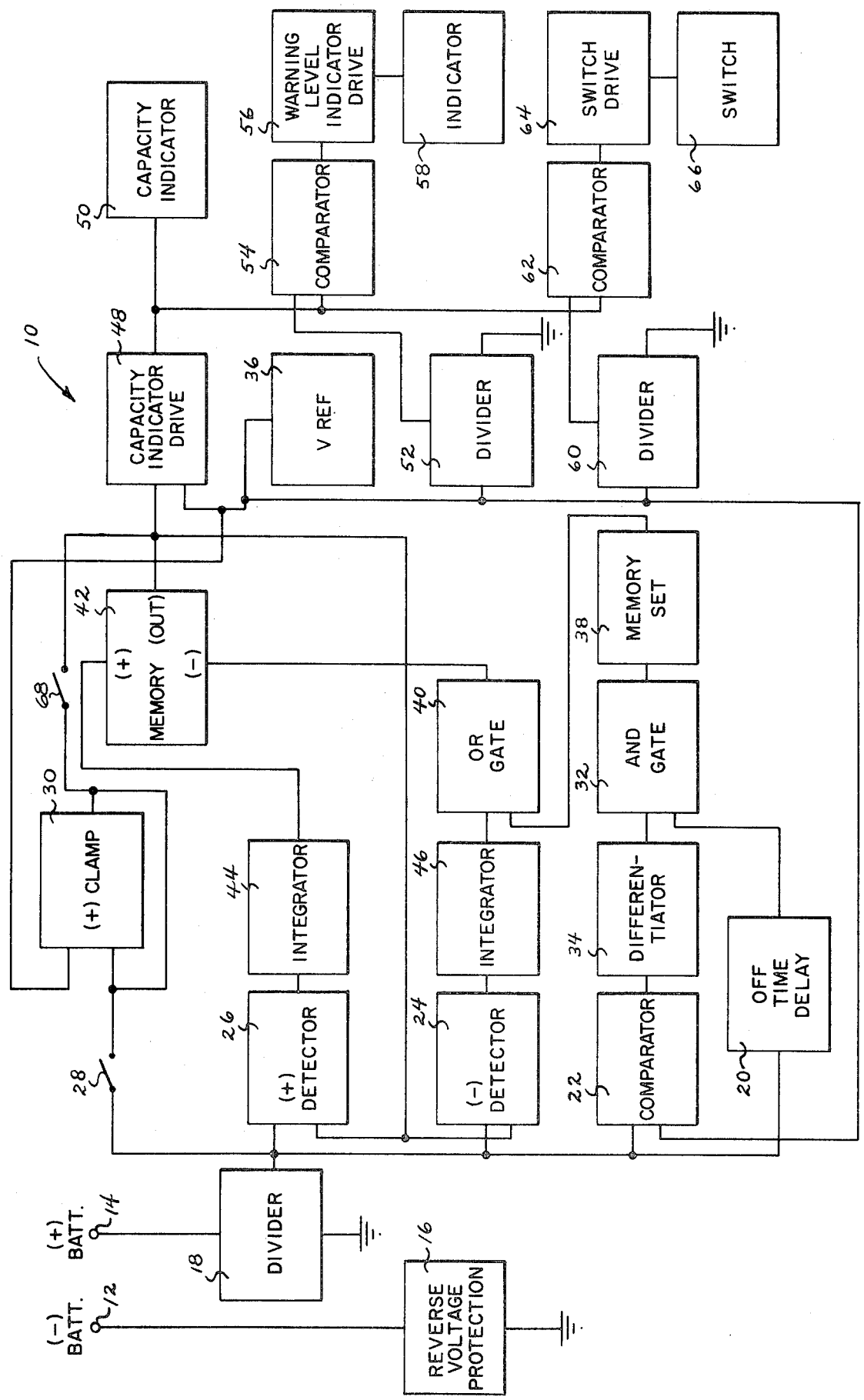

METHOD AND APPARATUS FOR DETERMINING THE CAPACITY OF LEAD ACID STORAGE BATTERIES

BACKGROUND OF THE INVENTION

The present invention relates to instruments for use with lead acid storage batteries and more particularly, to a method and apparatus for determining the capacity of a lead acid storage battery.

Lead acid storage batteries are used as motive power on fork lift trucks, tow tractors, mining vehicles, golf carts and other electric vehicles. In many of these uses, particularly industrial materials handling, the batteries are not continuously charged as they are, for example, in automobiles. Instead, they are normally discharged in operation and then recharged and readied for another discharge cycle.

The need for some form of battery protection against damage from overcharging and progressive undercharging has been recognized for many years. Existing devices for this purpose have been available under such names as discharge warning indicator, battery condition indicator, battery energy saver, battery discharge control, expanded scale voltmeter, battery protector, and battery fuel gauge. Such devices are generally used in combination with a hydrometer reading of the specific gravity of the battery electrolyte. Generally, this measurement is taken just prior to changing on a single "pilot" cell selected on a rotational basis. This measurement is used to monitor the accuracy of whatever other battery protection device is installed.

Typically, such devices have, in practice, proven inadequate or impractical for one or more of the following reasons:

1. If fitted with a gauge or meter, the device may be over-sensitive to the application or workload. Heavy lifting, higher stacking, frequent lifting, and driving rapidly up a ramp with a load, can cause a sudden voltage drop that makes the meter indicator needle swing erratically.

2. If given only a simple warning light, the operator has no way of judging how close he is getting to the warning point. Such lights usually indicate the beginning of a preset period of time, normally two to fifteen minutes, before a relay acts to disable lifting and possibly other truck functions. This time may be insufficient for the operator to reach a convenient point in his work before charging. In addition, it is not uncommon for the operator to react to the building time pressure with aggression by damaging or sabotaging the device.

3. Generally such devices measure or monitor cell voltage under load; I.E., during truck operation. As indicated above, momentary surges in this voltage due to lifting, etc. tend to trigger the lift lockout switch as the battery approaches 50% discharge. To avoid this, in recent years such devices have commonly averaged the voltage under load over some period of time such as, three minutes. However, the devices may still trigger the lockout switch prematurely because the loaded voltage is affected by the discharge rate. In other words, a given battery may exhibit a given final voltage over a broad range of levels of charge, i.e., from 90% charge to 20% charge. Lift lockout, therefore, remains premature or unreliable and the battery may still be damaged by excessive discharge.

4. Some devices can be manually reset or overridden by the operator. Sometimes a manual "reset" button is provided for the purpose, or the operator may find he can "fool" the device into sensing it has been connected to a recharged battery by simply unplugging and replugging from the battery which needs recharging. Other devices provide for adjustment of the warning and/or reset point which can be counter-productive. Finally, operators may simply short out the device in a way that makes it difficult to determine whether vandalism has occurred.

5. Devices that require or permit calibration by the user may not be properly set for the battery type and workload conditions under which they are employed.

6. Some devices may either not sense or not indicate the temporary increase in available capacity due to "recovery" or rest. If such increases in capacity are not recognized, they tend to go unutilized.

7. Many battery protection devices restrict operations by requiring a battery that is 80–100% recharged before they will reset after lift lockout. While it is generally not considered good practice to send a truck out with a partially charged battery, this could be desirable near the end of the final shift of the day.

8. Finally, battery protection devices that are properly adjusted for new batteries may fail to operate as desired when connected to older or less well-maintained batteries. Such batteries typically exhibit a lower specific gravity when fully charged and reach the specific gravity equivalent to their recharge point in less time.

OBJECTS OF THE INVENTION

It is a general object of the invention to provide a method and apparatus for determining the capacity of lead acid storage batteries.

It is a specific object of the invention to provide battery capacity indicator that avoids all of the above-listed shortcomings of the prior art battery capacity determining apparattii.

It is another specific object of the invention to provide a display of battery capacity as a stable, linear, proportional function.

It is still another object of the invention to optionally provide a warning indication of low battery capacity and switch cut-out means at preselected levels of capacity indication.

It is a feature of the invention that the battery capacity determining apparatus can be used during the charging cycle of a lead acid battery as well as during the discharge cycle.

BRIEF DESCRIPTION OF THE INVENTION

The method and apparatus of the present invention utilizes two battery parameters to determine battery capacity during the discharge cycle. The battery parameters are the open circuit voltage and the voltage under load. The open circuit voltage has a linear type correlation to the charge level of the battery under a defined set of circumstances. The voltage under load when compared to the corresponding open circuit voltage at any charge level is an indication of the rate of discharge of the battery at that time.

The open circuit voltage characteristic is used as the battery capacity correlation. The open circuit voltage is presented by the battery upon initial connection of the battery to the indicator for each period of discharge. The open circuit voltage may be presented by the battery during periods of non-discharge although these periods are not necessary for the indicator's operation. After the initial connection of the battery to the indicator, the discharge rate or rates, as indicated by the loaded voltage, is detected and supplied to the indicating means in values of open circuit voltage. This manufactured open circuit voltage value or the open circuit voltage value supplied by the open circuit voltage detector is then used as a reference to the loaded voltage detector to maintain its ability to detect discharge rates.

For the charge cycle operation, the two battery parameters used are the open circuit voltage and the voltage during charge. The voltage exhibited by the battery during charge when compared to the corresponding open circuit voltage value is an indication of the rate of charge of the battery. The initial open circuit voltage value reference is supplied as a result of the discharge period.

The charge rate as indicated by the charge voltage value is detected and supplied to the indicating means in values of open circuit voltage.

DESCRIPTION OF THE DRAWINGS

The objects and features of the invention discussed above and other objects and features of the invention will best be understood from a detailed description of a preferred embodiment thereof selected for purposes of illustration and shown in the accompanying single FIGURE which depicts in block diaphragm form the circuitry of the invention.

DETAILED DESCRIPTION OF A PREFERRED EMBODIMENT OF THE INVENTION

Turning now to the single FIGURE of the drawings, there is shown in block diagram form an apparatus for determining the capacity of a lead acid storage battery that is constructed in accordance with the present invention and indicated generally by the reference numeral 10. The apparatus 10 will be referred to as a "battery capacity indicator" or "BCI". The battery under test is connected to input terminals 12 and 14 of the battery capacitor indicator. If the battery is accidently connected with reverse polarity, a reverse voltage protection circuit 16, such as a properly poled diode, prevents operation of the battery capacity indicator.

Assuming that the battery under test is correctly connected to the input terminals 12 and 14, a positive voltage is applied through voltage divider 18 to an "OFF" time delay circuit 20, a comparator 22, a negative voltage detector 24, a positive peak detector 26 and a switch 28. If the battery capacity indicator 10 is used in the "discharge" mode to determine the battery capacity under load, switch 28 is closed and the divided down voltage from the battery under test is also applied to a positive clamp circuit 30.

If the battery under test has been disconnected from the BCI 10 for a predetermined length of time that is established by the "OFF" time delay circuit 20, the delay circuit 20 will produce an output that is applied to one input of an AND gate 32. The other input to AND gate 32 is the differentiated output from comparator 22 through differentiator 24. The comparator 22 compares the voltage of the battery under test with a reference voltage derived from voltage reference 36. The voltage reference 36 can be a separate voltage source or it can be a voltage that is derived from the battery under test by means of a suitable zener diode. The voltage difference between the divided down battery voltage and the reference voltage is differentiated by differentiator 34 to produce a pulse input to the AND gate 32. Given an output from the previously mentioned "OFF" time delay circuit 20, AND gate 32 produces an output to memory set 38, the output of which is inputed to an OR gate 38. The output of OR gate 40 is used to set a memory 42 to a predetermined voltage value below that of a fully discharged battery.

When the battery under test was initially connected to BCI 10, the divided down, open circuit, positive battery voltage was applied not only to comparator 22, but also to the (+) peak detector 26. The applied open circuit battery voltage is integrated by integrator 44. At the end of the integration period, the memory 42 is supplied with a total open circuit voltage value of the battery under test. Since the reference voltage to the (+) peak detector 26 is supplied by the output from memory 42, when the memory output voltage value is equal to the open circuit voltage value, the (+) peak detector 26 will produce no output.

When the battery is placed under load, the difference between the open circuit voltage value from the memory output and the loaded voltage value presented to the (−) voltage detector 24 determines the rate of discharge of the battery. The loaded voltage battery value is detected by the (−) voltage detector 24 and supplied to the negative or the low side of memory 42 through integrator 46 and OR gate 40. The difference value supplied to the (−) memory input corresponds to the change in value of the open circuit voltage during discharge.

As previously mentioned, when the battery capacity indicator 10 is in the battery "discharge" mode of operation, switch 28 is closed and the divided down battery voltage also is applied to the (+) clamp circuit 30. The clamp circuit 30 prevents an indication beyond full charge due to a nonlinear value of the open circuit voltage exhibited by the battery at or near full charge. This voltage is commonly referred to as the "surface charge".

The output of memory circuit 42 can be used in a variety of ways to provide an indication of battery capacity and a low battery capacity and/or to operate appropriate protective switching equipment when the battery capacity reaches a predetermined level. These three functions are shown in block diagram form in the single FIGURE of the drawing.

The output from memory 42 is inputted to a capacity indicator drive 48 that produces an appropriate drive signal for a conventional capacity indicator 50. The capacity indicator 50 can be calibrated in terms of percentage of battery capacity or in the conventional "fuel gauge" nomenclature of "full", three-quarters, half, quarter and "empty". The capacity indicator 50 also can be instrumented to provide an analog output and/or a digital display of battery capacity.

It is often advisable to provide a warning level indication in visual and/or audible form. For this purpose, the voltage from reference source 36 is divided down by a divider 52 and applied as one input to a comparator 54. The other input to comparator 54 is obtained from the output of the capacity indicator drive 48. The output from comparator 48 is applied to a warning level indicator drive 56 that provides an appropriate drive for an indicator 58. The indicator 58 can be a visual indication and/or an audible indication that the battery under test has reached a predetermined discharge level.

In battery motive applications, it is often desirable to provide an automatic disconnection of the vehicle's battery system* when the batteries have reached a predetermined level of discharge. For this purpose, the reference voltage from source 36 is divided down by divider 60 and applied as one input to a comparator 62. The other input to the comparator is the output from capacity indicator drive 48. The output from comparator 62 actuates a switch drive 64 that operates switch 66 to disconnect the vehicle's battery or the selected vehicle function.

*or a selected vehicle function e.g. fork lift

The preceeding discussion has been directed to the use of the battery capacity indicator 10 in the battery "discharge" mode. The apparatus also can be used to determine the capacity of the battery during a "charge" mode. In the "charge" mode, the open circuit voltage value i.e. the output of memory 42 and the charge value presented to the (+) peak detector 26 determines the rate-of-charge of the battery. The charge voltage value is detected by the (+) peak detector and supplied to the positive input of memory 42 through integator 44. The value supplied to the positive memory input corresponds to the change in value of the open circuit battery voltage at different levels of charge. In this mode, switch 28 is in the open position as previously mentioned.*

*The memory output value can be limited to a predetermined value during the "charge" cycle to prevent the BCI from indicating beyond "full" charge. This is accomplished by clamping the memory output to VREF 36 through a switch means 68 or by hard wiring.

Having described in detail the preferred embodiment of my invention, it will now be apparent to those skilled in the art that numerous modifications can be made therein without departing from the scope of the invention as defined in the appended claims. What I claim and desire to secure by Letters Patent of the United States is:

1. A method for determining the capacity of a lead acid storage battery, said method comprising the steps of:
   (1) sensing an initial open circuit voltage of the battery when no current flows through the battery;
   (2) storing the value of said initial open circuit voltage;
   (3) sensing the voltage of the battery while current flows through the battery in a first direction;
   (4) comparing the value of the sensed voltage with the value of the stored initial open circuit voltage to produce a difference value representing the rate of current flow through the battery in said first direction;
   (5) adjusting said stored initial open circuit voltage value as a function of said difference value to produce a first direction current flow, adjusted, stored voltage value; and,
   (6) utilizing said first direction current flow, adjusted, stored voltage value, said value representing the then capacity of the battery while current flows therethrough in said first direction.

2. The method of claim 1 further comprising thereafter the steps of:
   (1) sensing for a second time the voltage of the battery while current flows through the battery in said first direction;
   (2) comparing the value of the second time sensed battery voltage with the first direction current flow, adjusted, stored voltage value;
   (3) adjusting said first direction current flow, adjusted, stored voltage value as a function of the difference between the value of the second time sensed voltage of the battery while current flows therethrough in the first direction and said first direction current flow, adjusted, stored voltage value to produce a first direction current flow, newly adjusted, stored voltage value; and,
   (4) utilizing said first direction current flow, newly adjusted, stored voltage value, said newly adjusted, stored voltage value representing the then capacity of the battery while current flows therethrough in said first direction.

3. The method of claim 1 further comprising the step of repeating step (1) through (4) of claim 2 n times where n≧1.

4. The method of claim 1 further comprising the steps of:
   (1) sensing the voltage of the battery for a predetermined period of time while current flows through the battery in said first direction; and,
   (2) integrating said sensed voltage over at least a portion of said predetmined time period.

5. The method of claim 1 further comprising the steps of:
   (1) sensing the voltage of the battery while current flows through the battery in a second and opposite direction;
   (2) comparing the value of the sensed voltage while current flows in said second and opposite direction with the value of the stored initial open circuit voltage to produce a difference value representing the rate of current flow through the battery in said second and opposite direction;
   (3) adjusting said stored initial open circuit voltage value as a function of the difference between the value of the sensed voltage while current flows in said second and opposite direction and said stored initial open circuit voltage value to produce a second direction current flow, adjusted, stored voltage value;
   (4) utilizing the second direction current flow, adjusted, stored voltage value, said value representing the then capacity of the battery while current flow therethrough in said second and opposite direction.

6. The method of claim 5 further comprising thereafter the steps of:
   (1) sensing for a second time the voltage of the battery while current flows through the battery in said second and opposite direction;
   (2) comparing the value of the second time sensed voltage while current flows in the second and opposite direction with the second direction current flow, adjusted, stored voltage value;
   (3) adjusting said second direction current flow, adjusted, stored voltage value as a function of the difference between the value of the second time sensed voltage of the battery while current flows therethrough in said second and opposite direction and said second direction current flow, adjusted, stored voltage value to produce a second direction current flow, newly adjusted, stored voltage value; and,
   (4) utilizing said second direction current flow, newly adjusted, stored voltage value, said newly adjusted, stored voltage value representing the then capacity of the battery while current flow therethrough in said second and opposite direction.

7. The method of claim 6 further comprising the steps of repeating steps (1) through (4) of claim 6 n times where $n \geq 1$.

8. A method for determining the capacity of a lead acid storage battery, said method comprising the steps of:
   (1) sensing an initial open circuit voltage of the battery prior to a discharge period;
   (2) storing the value of said initial open circuit voltage;
   (3) sensing the voltage of the battery under load;
   (4) comparing the value of the sensed loaded voltage with the value of the stored initial open circuit voltage to produce a difference value representing the rate of discharge of the battery;
   (5) adjusting said stored initial open circuit voltage value as a function of said difference value to produce an adjusted, stored voltage value; and,
   (6) utilizing said adjusted, stored voltage value, said value representing the then capacity of the battery.

9. The method of claim 8 further comprising thereafter the steps of:
   (1) sensing for a second time the voltage of the battery under load;
   (2) comparing the value of the second time sensed loaded voltage with the adjusted, stored voltage value;
   (3) adjusting said previously adjusted, stored voltage value as a function of the difference between the value second time sensed loaded voltage and said previously adjusted, stored, voltage value to produce a newly adjusted, stored voltage value; and,
   (4) utilizing said newly adjusted, stored voltage value, said newly adjusted, stored voltage value representing the then capacity of the battery.

10. The method of claim 9 further comprising the steps of repeating steps 1 through 3 of claim 8 n times where $n \geq 1$.

11. The method of claim 8 further comprising the steps of:
    (1) sensing the voltage of the battery for a predetermined period of time while the battery is under load; and,
    (2) integrating said sensed voltage over at least a portion of said predetermined time period.

12. A method for determining the capacity of a lead acid storage battery, said method comprising the steps of:
    (1) sensing an initial open circuit voltage for the battery prior to a charge period;
    (2) storing the value of said initial open circuit voltage;
    (3) sensing the voltage of the battery under charge;
    (4) comparing the value of the sensed charge voltage with the value of the stored initial open circuit voltage to produce a different value representing the rate of charge of the battery;
    (5) adjusting said stored initial open circuit voltage value as a function of said difference value to produce an adjusted, stored voltage value; and,
    (6) utilizing said adjusted, stored voltage value, said value representing the then capacity of the battery.

13. The method of claim 12 further comprising thereafter the steps of:
    (1) sensing for a second time voltage of the battery under charge;
    (2) comparing the value of the second time sensed charged voltage with the adjusted, stored voltage value;
    (3) adjusting said previously adjusted, stored voltage value as a function of the difference between the value second time sensed charge voltage and said previously adjusted, stored, voltage value to produce a newly adjusted, stored voltage value; and,
    (4) utilizing said newly adjusted, stored voltage value, said newly adjusted, stored voltage value representing the then capacity of the battery.

14. An apparatus for determining the capacity of a lead acid storage battery comprising:
    (1) means for sensing an initial open circuit voltage of the battery when no current flows through the battery;
    (2) means for storing the value of said initial open circuit voltage;
    (3) means for sensing the voltage of the battery while current flows through the battery through the battery in a first direction;
    (4) means for comparing the value of the sensed voltage with the value of the stored initial open circuit voltage to produce a difference value representing the rate of current flow through the battery in said first direction;
    (5) means for adjusting said stored initial open circuit voltage value as a function of said difference value to produce a first direction current flow, adjusted, stored voltage value; and,
    (6) means for utilizing said first direction current flow, adjusted, stored voltage value, said value representing the then capacity of the battery while current flows therethrough in said first direction.

15. The apparatus of claim 14 further comprising:
    (1) means for sensing the voltage of the battery while current flows through the battery in a second and opposite direction;
    (2) means for comparing the value of the sensed voltage while current flows in said second and opposite direction with the value of the stored initial open circuit voltage to produce a difference value representing the rate of current flow through the battery in said second and opposite direction;
    (3) means for adjusting said stored initial open circuit voltage value as a function of the difference between the value of the sensed voltage while current flows in said second and opposite direction and said stored initial open circuit voltage value to produce a second direction current flow, adjusted, stored voltage value;
    (4) means for utilizing the second direction current flow, adjusted, stored voltage value, said value representing the then capacity of the battery while current flow therethrough in said second and opposite direction.

16. An apparatus for determining the capacity of a lead acid storage battery comprising:
    (1) means for sensing an initial open circuit voltage of the battery prior to a discharge period;
    (2) means for storing the value of said initial open circuit voltage;
    (3) means for sensing the voltage of the battery under load;
    (4) means for comparing the value of the sensed loaded voltage with the value of the stored initial open circuit voltage to produce a difference value representing the rate of discharge of the battery;

(5) means for adjusting said stored initial open circuit voltage value as a function of said difference value to produce an adjusted, stored voltage value; and, (6) means for utilizing said adjusted, stored voltage value, said value representing the then capacity of the battery.

17. An apparatus for determining the capacity of a lead acid storage battery comprising:

(1) means for sensing an initial open circuit voltage for the battery prior to a charge period;

(2) means for storing the value of said initial open circuit voltage;

(3) means for sensing the voltage of the battery under charge;

(4) means for comparing the value of the sensed charge voltage with the value of the stored initial open circuit voltage to produce a different value representing the rate of charge of the battery;

(5) means for adjusting said stored initial open circuit voltage value as a function of said difference value to produce an adjusted, stored voltage value, said value representing the then capacity of the battery.

* * * * *